(12) United States Patent
Yoshikawa

(10) Patent No.: US 7,176,735 B2
(45) Date of Patent: Feb. 13, 2007

(54) WAVE-SHAPING CIRCUIT

(75) Inventor: Osamu Yoshikawa, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/097,520

(22) Filed: Apr. 1, 2005

(65) Prior Publication Data

US 2006/0017481 A1 Jan. 26, 2006

(30) Foreign Application Priority Data

Jul. 26, 2004 (JP) ............................... 2004-217631

(51) Int. Cl.
*H03K 3/107* (2006.01)
*H03K 5/04* (2006.01)
(52) U.S. Cl. ...................... 327/172; 323/222; 327/100; 327/175
(58) Field of Classification Search ................ 327/100, 327/172–175, 170; 363/89, 21; 323/222, 323/284
See application file for complete search history.

(56) References Cited

U.S. PATENT DOCUMENTS

| | | | |
|---|---|---|---|
| 4,355,277 A * | 10/1982 | Davis et al. ................. | 323/351 |
| 4,459,537 A * | 7/1984 | McWhorter ................. | 323/224 |
| 5,371,439 A * | 12/1994 | Griffin ..................... | 315/209 R |
| 5,801,935 A * | 9/1998 | Sugden et al. ............... | 363/89 |
| 6,320,298 B1 | 11/2001 | Kawabe | |

2003/0067449 A1 4/2003 Yoshikawa et al.

FOREIGN PATENT DOCUMENTS

EP   0 668 166 A   8/1995

OTHER PUBLICATIONS

Patent Abstracts of Japan for JP2004-021697 published on Jan. 22, 2004.
"A digitally-controller, low-cost driver for piezoceramic flight control surfaces in small unmanned aircraft and munitions", Dillard et al., APEC 2002, 17th, Annual IEEE Applied Power Electronics Conference And Exposition, Dallas, TX., Mar. 10-14, 2002, Annual Applied Power Electronics Conference, New York, NY: IEEE, US, vol. 2 of 2. Conf. 17, Mar. 10, 2002, pp. 1154-1160.
European Search Report for EP 05 25 2096 completed Sep. 27, 2005.

* cited by examiner

*Primary Examiner*—Dinh T. Le
(74) *Attorney, Agent, or Firm*—Darby & Darby

(57) ABSTRACT

In a wave-shaping circuit, a charging switching element in series with an inductor is switched, a capacitor is charged with a back electromotive force generated by the inductor, a discharging switching element in series with a discharge resistor is switched, and the charge in the capacitor is discharged. By controlling the timing at which the charging switching element and the discharging switching element are switched, the power supply voltage can be increased and it is possible to generate a charge voltage for which the slope of the envelope can be determined. As a result, an output voltage with a desired output voltage waveform can be obtained from the charge voltage. The wave-shaping circuit is a simple circuit that does not include a transformer is used to increase the voltage of a low-voltage power supply and to form an output voltage waveform from a DC waveform.

12 Claims, 6 Drawing Sheets

WAVE-SHAPING CIRCUIT

INCORPORATION BY REFERENCE

The present application claims priority under 35 U.S.C. §119 to Japanese Patent Application No. 2004-217631 filed on Jul. 26, 2004. The content of the application is incorporated herein by reference in its entirety.

TECHNICAL FIELD OF THE INVENTION

The present invention relates to a wave-shaping circuit that raises the power supply potential of a DC power supply and performs wave shaping.

BACKGROUND OF THE INVENTION

In portable devices such as notebook PCs and portable telephones, batteries for low power consumption of about 5V DC (volts direct current) are used as power supplies so that the devices can be used for extended periods even at locations where a commercial power supply cannot be used. In these portable devices, however, there are circuit modules that operate at an AC (alternating current) potential of about +/−100V with a special potential waveform, e.g., vibrating elements that indicate to the user that an input operation has been acknowledged or that a signal has been received.

Conventionally, operating this type of circuit module requires a potential step-up circuit that raises a low potential of approximately 5V to a potential of approximately +/−100V and a wave-shaping circuit that shapes the DC potential waveform obtained from the power supply into a desired drive potential waveform suited for the circuit module (see, e.g., sections 0081–0085 and FIG. 7 of Japanese Laid-Open Patent Publication No. 2004-21697).

FIG. 10 shows a conventional wave-shaping circuit 100 that shapes an output potential to vibrate a piezoelectric substrate 13 serving as the circuit module. In the wave-shaping circuit 100, a step-up oscillator circuit 101 generates an oscillation of 20–200 kilohertz (kHz) for the fixed DC potential power supply of a few volts. A potential step-up circuit 102 switches the current flowing through a coil at a period based on the step-up oscillator circuit 101. The fixed DC potential power supply of a few volts is increased to a DC potential of 100V, which is sent to an amplifier circuit 103.

A vibration oscillator circuit 104 generates a drive signal at a frequency that operates a piezoelectric substrate 13, and this drive signal is sent to the amplifier circuit 103. The amplifier circuit 103 amplifies the drive signal using the DC potential received from the step-up circuit 102, and the result is sent to the piezoelectric substrate 13 to serve as the drive potential.

With this wave-shaping circuit 100, a drive potential waveform suited for the operation of the circuit module (piezoelectric substrate 13) can be generated by setting up the frequency of the drive signal generated by the vibration oscillator circuit 104 and the pulse width generated by a pulse width generation circuit 106.

However, this conventional wave-shaping circuit 100 is equipped with circuits having two objectives: stepping up the voltage with the step-up circuit 101 and obtaining the desired potential waveform with the circuits 104, 105, 106. Thus, large circuit components, including transformers, are necessary, resulting in a complex circuit structure, a higher number of components, and increased costs. In particular, with portable devices that need to be carried around, there is a need to make the device as light and compact as possible. The inclusion of large components such as a transformer makes it impossible to meet this need.

Furthermore, a high potential is continuously generated by the step-up circuit 102 regardless of whether or not there is an incoming vibration trigger. This increases the danger of electrical leakage and short-circuits. Furthermore, since power is continuously consumed to step up the voltage, the lifespan of the battery is reduced.

SUMMARY OF THE INVENTION

The object of the present invention is to overcome these problems of the conventional technology and to provide a wave-shaping circuit using a simple circuit that does not use a transformer and that steps up the potential from a low-potential power supply while shaping an output potential waveform from a DC current.

Another object of the present invention is to provide a wave-shaping circuit that steps up a power supply potential only when a load needs to be driven with a high-potential output waveform so that a high potential is not flowing continuously in a circuit and power consumption is reduced.

In order to achieve the objects described above, a wave-shaping circuit according to an embodiment of the present invention includes an inductor connected in series to a DC power supply by way of a charging switching element, a capacitor connected in parallel to the charging switching element, a reverse-current preventing element disposed between the inductor and the capacitor with a direction from the inductor to the capacitor being a forward direction, a discharge resistor connected parallel to the capacitor along with a discharge switching element connected in series, and a controller selectively sending a pulse control signal to either the charging switching element or the discharge switching element. The control signal sets a pulse width and a pulse rest width for each pulse repetition period.

The pulse control signal turns the charging switching element or the discharge switching element, thereby raising or lowering a charge potential of the capacitor so that a desired output potential waveform increased from a potential of the DC power supply is formed between a pair of output terminals connected to terminals of the capacitor.

The pulse control signal turns the charging switching element on and off. In the off state, the counterelectromotive force generated in the inductor causes charge current for charging the capacitor to flow from the inductor, raising the charge potential of the capacitor. When the charge switching element is turned on, the discharge current that tries to flow from the capacitor to the inductor is blocked by the reverse-current preventing element so that the charge potential is kept roughly the same. By using the pulse control signal to repeatedly turn the element on and off, a desired charge potential i.e., output potential, that has been stepped up from the potential of the DC power supply can be provided.

Also, the charge potential from the capacitor during a single on/off control operation is roughly proportional to the "on" time period. As a result, the pulse width or the pulse resting width of the pulse control signal controlling the charge switching element can be set up as desired to adjust the downward slope of the output potential.

By using the pulse control signal, for which pulse width and pulse resting width are set up for each repetition period, to repeatedly control on/off operations selectively between the charge switching element and the discharge switching element, an output potential that has been stepped up from the DC power supply can be provided to the terminals of the capacitor with the desired output potential waveform.

A wave-shaping circuit as described above can also include selecting means disposed between the pair of output terminals for reversing connections therebetween. An output potential waveform with a polarity that is inverted from a charge potential of the capacitor can be formed between the pair of output terminals.

By switching the connections between the capacitor terminals and the pair of output terminals, an output potential can be generated between the pair of output terminals that is equivalent to the charge potential of the capacitor but with inverted polarity. As a result, by selectively switching, an output potential that is twice the charge potential of the capacitor and that has the desired potential waveform can be provided.

In a wave-shaping circuit as described above, the pulse control signal can be a modulated signal in which a duty cycle is changed for each pulse repetition cycle via pulse width modulation.

Since the pulse width and the pulse resting width of the pulse control signal are determined by data from the modulation signal, it is possible to adjust the slope of the output potential by using the modulation signal data to set up the on/off control times for the charge switching element and the discharge switching element.

In a wave-shaping circuit as described as described above, a vibrating element connected between the pair of output terminals can be vibrated by the output potential with the desired output potential waveform.

Even with a vibrating element that vibrates when a high potential is applied, a vibration can be obtained with a desired potential waveform using a low-potential power supply.

In a wave-shaping circuit as described above, the vibrating element can be a piezoelectric substrate secured to a touch panel of a touch panel input device, and when an input operation to the touch panel is detected, the output potential with the desired output potential waveform is used to vibrate the piezoelectric substrate.

Since the piezoelectric substrate can be vibrated with a desired potential waveform, different tactile feedback can be provided to an operator according to the operation performed.

In a wave-shaping circuit as described above, the capacitor can have an internal capacitance of a load connected between the pair of output terminals.

Since the internal capacitance of the load is used as the capacitor for forming the output potential, there is no need to provide a separate capacitor in the circuit.

According to the invention described above, a high potential can be generated and a desired potential waveform is formed with the stepped-up potential without the use of a transformer to step up the potential of a low-potential power supply. Thus, the circuit structure can be significantly simplified and a compact and inexpensive design can be provided.

Also, since output potential is provided by controlling the charge switching element only when the load needs to be driven with a high-potential output potential waveform, unnecessary power consumption is avoided and the lifespan of the low-potential power supply can be significantly extended.

Furthermore, since there is no continuous flow of high-potential through the circuit, the circuit becomes safer.

In addition to these advantages, according to the invention described above, a high output potential that is at or greater than the charge potential of the capacitor can be formed between the pair of output terminals simply by switching connections.

In addition to these advantages, according to the invention described above, a digital signal can be used to set the slope of the output potential, making controllers such as microprocessors suitable for providing control.

In addition to these advantages, according to the invention described above, potential waveforms with different output potentials can be applied to the vibration element so that vibrations with different tactile sensations can be generated at the vibration element.

In addition to these advantages, according to the invention described above, a touch panel can be vibrated to provide different sensations based on operations performed on the touch panel, the operator's tastes, and the like.

In addition to these advantages, according to the invention described above, the internal capacitance of the load is used so that there is no need to have a separate capacitor in the circuit. This makes it possible to use a simpler circuit to provide a stepped-up output potential with a desired waveform.

BRIEF DESCRIPTION OF THE DRAWINGS

The foregoing and other features of the present invention will be more readily apparent from the following detailed description and drawings of the illustrative embodiments of the invention wherein like reference numbers refer to similar elements and in which.

DETAILED DESCRIPTION OF THE PREFERRED EMBODIMENTS

Figure 1A:
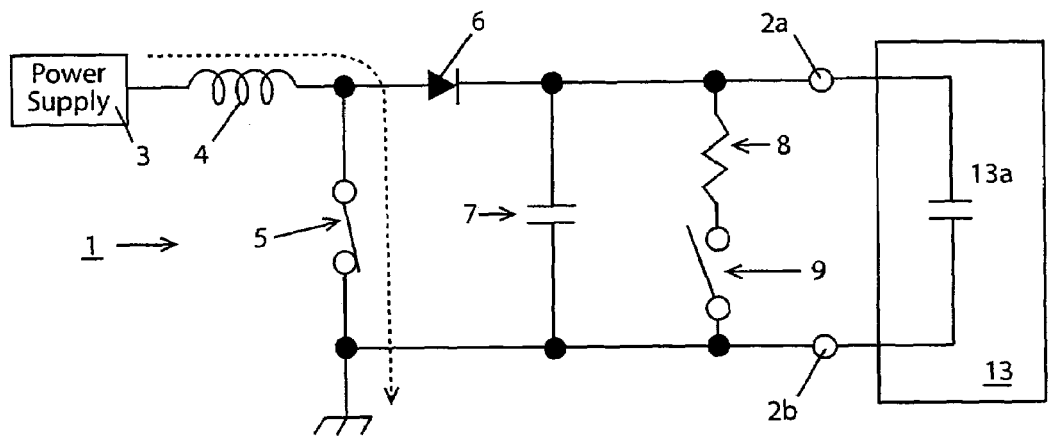
FIGS. 1A and 1B are circuit diagrams for the purpose of describing the principles used by the present invention in forming an upwardly sloping output potential.

First, the principles behind the operation of a wave-shaping circuit 1 according to the present invention will be described using FIGS. 1 and 2. FIGS. 1A–1B are circuit diagrams used in the operations performed in forming an output potential with an increasing slope between output terminals 2a, 2b. FIG. 2 is a circuit diagram used in the operations performed in forming an output potential with a decreasing slope between the output terminals 2a, 2b.

The circuit diagrams show a low-potential DC power supply 3 supplying a DC power, e.g., approximately 5V, a coil 4 serving as an inductor, and a charging switch 5 connected in series to the coil 4 and the low-potential DC power supply 3. A diode 6 and a capacitor 7, connected in series to each other, are connected in parallel to the charging switch 5. The diode 6 is a reverse-current preventing element where the direction from the coil 4 to the capacitor 7 is a forward bias. As will be described later, when the capacitor 7 is charged, discharge current resulting from the charge potential is prevented from flowing in reverse from the capacitor 7 to the coil 4.

A discharge resistor 8 and a discharge switch 9 are connected in series to the terminals of the capacitor 7, and these terminals of the capacitor 7 serve as the output terminals 2a, 2b that connect to a load 13.

When forming an upwardly sloping output potential, the discharge switch 9 is kept open. As FIG. 1A shows, when the charging switch 5 is closed, a current flows through the coil 4 in the direction indicated by the arrow. This current increases as time elapses after the closing of the charging switch 5.

When the charging switch 5 is opened after a predetermined period of time and the current flowing through the coil 4 is cut off, a counterelectromotive force that tries to keep current flowing through the coil 4 is generated. The potential of this counterelectromotive force is dependent on the internal resistance of the load 13, not shown in the figure, connected by way of the diode 6, but as a constant, the value is roughly proportional to the "on" time from the closing of the charging switch 5 to the opening. Since the direction from the coil 4 to the capacitor 7 is the forward direction for the diode 6, the charge current flows in the direction indicated by the arrow in FIG. 1B and the counterelectromotive force generated by the coil 4 charges the internal capacitance of the capacitor 7 and the load 13.

Then, as the charging switch 5 is repeatedly opened and closed, a counterelectromotive force that tries to keep current flowing through coil 4 is generated each time the charging switch 5 is opened and the current flowing through the coil 4 is cut off. As a result, a capacitance of the capacitor 7 and an internal capacitance 13a of the load 13 is charged, and the charge potential is increased from the previous charge potential by the counterelectromotive force. When the charging switch 5 is closed and current is flowing through the coil 4, the discharge current flowing from the capacitance of the capacitor 7 and the internal capacitance 13a of the load 13 is cut off by the diode 6, thus maintaining the charge potential.

During a single period, in which the charging switch 5 is closed and then opened, the rising charge potential is roughly equivalent to the counterelectromotive force generated when the charging switch 5 is opened, ignoring the discharge current flowing through the internal resistance of the load 13 and the charge potential already charged. This counterelectromotive force is roughly proportional to the on time from the closing of the charging switch 5 to its opening.

More specifically, the increase in the charge potential over one period during which the charging switch 5 is closed and then opened is determined by the "on" time during which the charging switch 5 is closed. By repeating this operation, the slope of the upwardly increasing charge potential can be set up as desired, and the charge potential can be increased by a desired amount from the low-potential DC power supply 3.

Thus, by connecting the output terminals 2a, 2b to the terminals of the capacitor 7 and using the charging potential of the capacitor 7 as the output potential, a low-potential DC current can be stepped up to a higher potential and the output potential waveform can have a desired increasing slope.

To form a downward slope in the output potential, the charging switch 5 is kept open as shown in FIG. 2. When a discharge switch 9 is closed from this state as shown in FIG. 2, a discharge current flows through a discharge resistor 8 in the direction indicated by the arrow. The charge potential $V_t$ of the capacitor 7, t seconds after the discharge switch 9 is closed can be expressed as a function of t as follows:

$$V_t = V_o \varepsilon^{-\frac{1}{CR}t}$$

where $V_o$ is the charge potential of the capacitor 7 before the switch is closed, C is the sum of capacitance of the capacitor 7 and the internal capacitance 13a of the load 13, and R is the resistance of the discharge resistor 8.

Thus, the decrease in the charge potential is determined by the "on" time during which the discharge switch 9 is closed. Repeating the operation makes it possible to obtain a desired downward slope for the charge potential.

Thus, the output potential that appears between the output terminals 2a, 2b can be selected to have an upward slope or a downward slope by controlling the opening and closing of the charging switch 5 and the discharging switch 9, respectively. By performing these control operations continuously, a desired output waveform with a stepped-up potential can be obtained from the low-potential DC power supply 3.

If the internal resistance of the load 13 is small and the flow of discharge current through the internal resistance causes the charge potential waveform to slope downward by a fixed amount, with the slope being greater than the maximum desired downward slope of the output waveform, then it is possible to omit the discharge resistor 8 and the discharge switch 9. In this case, the internal resistance of the load 13 is able to substitute for the discharge resistor 8 and the charging process from FIG. 1 can also be used.

Referring to FIGS. 3–9, the following is a description of a wave-shaping circuit 20 according to an embodiment of the present invention that uses the principles described above to obtain a +/−100V sine waveform from a 5V DC low-potential power supply. In this embodiment, elements that are identical or similar to those from the wave-shaping circuit 1 in the description of operating principles above are assigned like numerals and the corresponding descriptions are omitted.

As shown in FIGS. 3–6, the wave-shaping circuit 20 is equipped with six types of switches (SW1, SW2, SW3, SW4, SW5, SW6) controlled by control signals from ports P0, P1, P2, P3 and a pulse control signal output from a PWM output terminal of the controller 21.

Figure 1B:
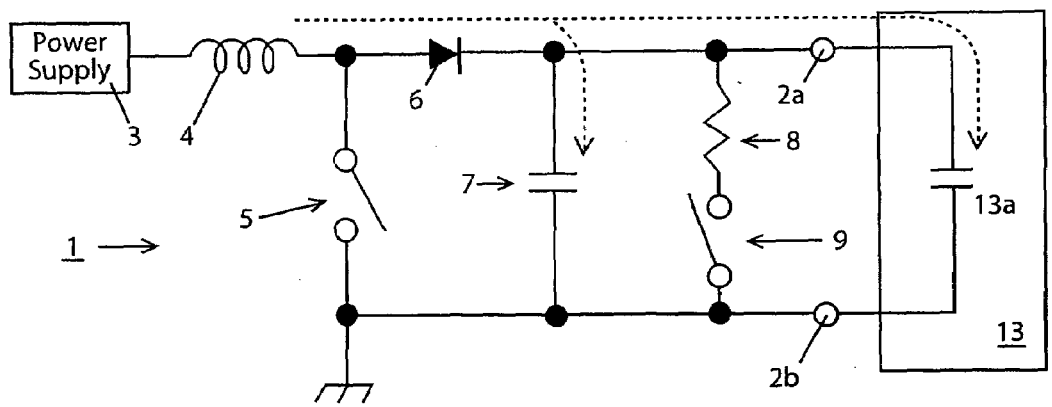
Figure 2:
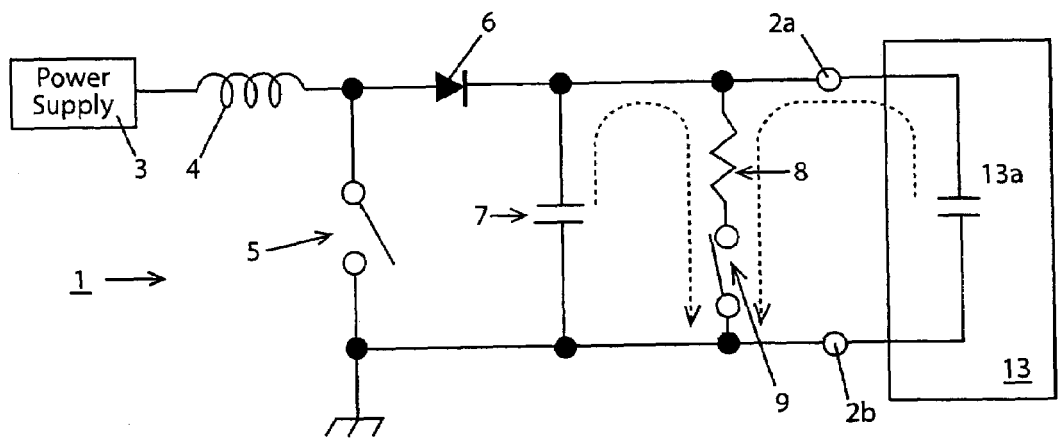
FIG. 2 is a circuit diagram for the purpose of describing the principles used by the present invention in forming a downwardly sloping output potential.
Figure 3:
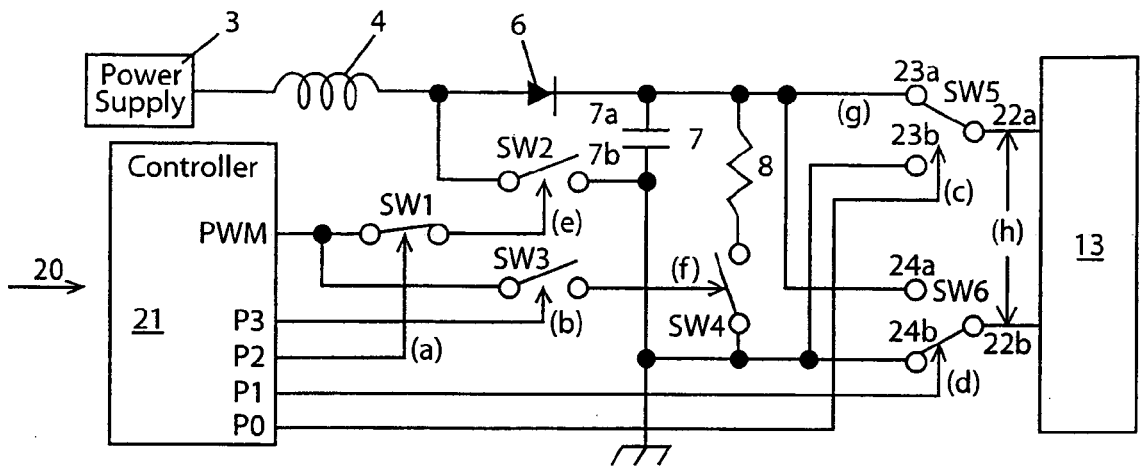
FIG. 3 is a circuit diagram illustrating the operation of the switches in the wave-shaping circuit, according to an embodiment of the present invention, in Phases 1 and 2.

The switch SW2 disposed between the coil 4 and a ground-side electrode of a capacitor 7 corresponds to the charging switch 5 of FIGS. 1A, 1B, and 2, and the switch SW4 disposed between a high potential side electrode 7a and the ground-side electrode 7b of the capacitor 7 corresponds to the discharge switch 9 of FIGS. 1A, 1B, and 2. The switch SW2 receives a pulse control signal that is output from the PWM output terminal in response to the closing of the switch SW1, and the switch SW2 opens and closes according to the pulse control signal as are described later. Also, the switch SW4 receives a pulse control signal that is output from the same PWM output terminal when the switch SW3 is closed, and the switch SW4 is similarly opened and closed according to the received pulse control signal.

When a potential waveform is being shaped, either one or the other of the switch SW1 and the switch SW3 is closed and consequently either one or the other of the switch SW2 and the switch SW4 is opened or closed by a pulse control signal. The switch not receiving the pulse control signal stays open. When the pulse of a pulse control signal is being received, the switch SW2 or the switch SW4 is closed, and when the pulse stops, the switch is open. In an embodiment, it is possible to have the switch closed when the pulse is stopped and the switch open when the pulse is received.

The switch SW1 and the switch SW3 are closed when "H"-level control signals are received from the port P2 and the port P3 and open when "L"-level signals are received.

The common terminal of the switch SW5 serves as one of the output terminals 22a that connects to the load 13, and the common terminal of the switch SW6 serves as the other output terminal 22b that connects to the load 13. Selector terminals 23a, 23b of the switch SW5, which switch the connection with the output terminal 22a, are electrically connected to the terminals of the capacitor 7, i.e., the high potential side electrode 7a and the ground-side electrode 7b, respectively. Also, similarly, the selector terminals 24a, 24b of the switch SW6, which switch the connection with the output terminal 22b, are also electrically connected to the terminals of the capacitor 7, i.e., the high potential side electrode 7a and the ground-side electrode 7b, respectively.

The switch SW5 and the switch SW6 are selectively controlled by control signals from the port P0 and the port P1. When an "H"-level control signal is output, the common terminals 22a, 22b are connected to the selector terminals 23a, 24a connected to the high potential side electrode 7a. When an "L"-level control signal is output, the common terminals 22a, 22b are connected to the selector terminals 23b, 24b connected to the ground-side electrode 7b.

Figure 8:
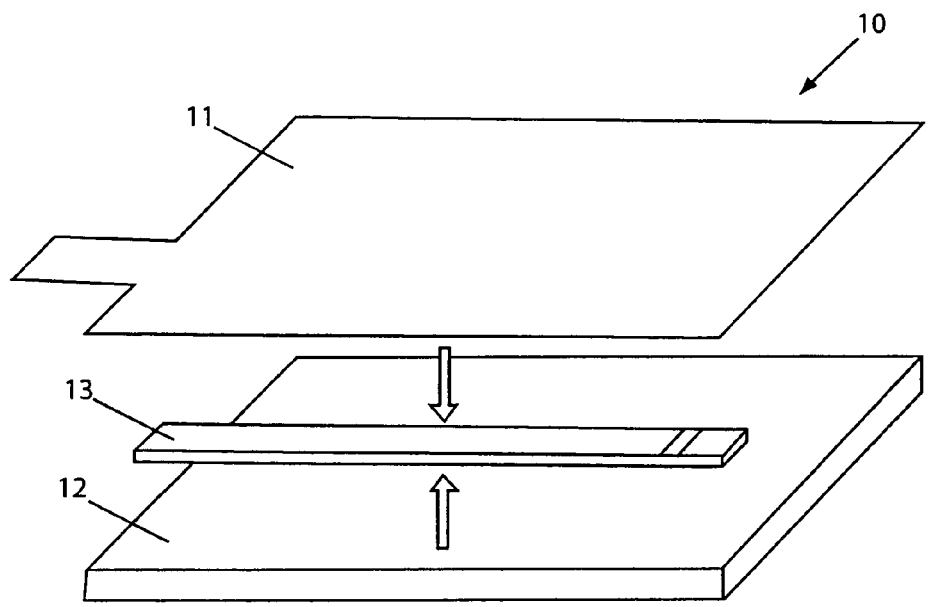
FIG. 8 is an exploded perspective drawing showing the simplified structure of a touch panel input device, according to an embodiment of the present invention.

In this example, the load 13 connected to the output terminals 22a, 22b is the piezoelectric substrate secured to a touch panel (movable plate) 11 of a touch panel input device 10, and the output terminals 22a, 22b are connected to a pair of electrodes driving the piezoelectric substrate 13 (FIG. 8).

The touch panel input device 10 detects a position at which pressure is applied to the movable plate 11 and outputs pressure position data. The movable plate 11 and the support substrate 12 forming the touch panel are layered and separated by a small distance. The facing surfaces of the movable plate 11 and the support substrate 12 are covered with a conductor layer formed from a uniform low-resistance film. Pressure applied to the movable plate 11 results in contact and continuity between the conductor layers so that the presence and position of pressure can be electrically detected.

The piezoelectric substrate 13 is a vibrating element that vibrates when the pressure position for the touch panel input device 10 is detected. This vibration causes the movable plate 11 to vibrate so that the operator can be notified via the finger pressing on the movable plate 11 that the pressure position has been detected. The piezoelectric substrate 13, formed as a long, thin strip, is secured to the back surface of the movable plate 11 in this example, as shown in the figure, and the output potential from the output terminals 22a, 22b is sent to the drive electrodes formed on the front and back of the piezoelectric substrate 13.

When a sine wave drive potential of approximately +/−100 V formed between the output terminals 22a, 22b is applied in the manner described above, the piezoelectric substrate 13 flexes along the thickness axis as indicated by the arrows shown in FIG. 8. This causes the secured movable plate 11 to be vibrated with an amplitude that is sufficient for recognition by the finger that is pressed against it.

When the piezoelectric substrate 13 is used as the load connected to the output terminals 22a, 22b in this manner, the charge potential of the capacitor 7 does not quickly drop because the piezoelectric substrate 13 has an internal resistance of 10 to 20 MΩ and a high internal capacitance. In order to convert this to the target downward slope of the output potential waveform, the switch SW4 and the discharge resistor 8 are used to force the charge potential down. If the charge potential is to dropped even more quickly, the discharge resistor 8 can be omitted and the internal resistance of the switch SW4 and the resistance of the conductor pattern connecting the capacitor 7 and the switch SW4 can be used as the discharge resistor 8.

In this embodiment, the sine wave potential waveform shown in FIG. 7H is formed by splitting a single waveform period into eight phases: Phase 1 through Phase 8. The switches SW1 through the switch SW6 are opened and closed for each phase.

The pulse control signal output from the PWM output terminal is a modulated signal in which pulse width modulation is applied using a modulating signal to change the duty cycle (impulse function), i.e., the pulse width ratio for one period, for each period. Different pulse modulating signals are assigned for each of the phases in Phases 1–8. The frequency of the pulse control signal is 20.80 kHz, which is the same in each phase. For each phase, a unit count is set up, where one unit is two periods of the pulse control signal, and the lengths of the phases are different. As a result, a potential waveform with a desired period can be formed from the eight phases.

The duty cycle of the pulse control signal increases or decreases by a fixed proportion for each continuous period, and this increase or decrease is set up for each phase. In other words, by setting up for each phase an initial duty cycle value, an increase or decrease, and a number of continuous units, it is possible to set up more combinations of pulse widths and "off" widths using limited modulating data compared to conventional pulse-width modulation systems where pulse widths are determined for each period of the pulse control signal.

In Phases 1 and 2, a potential waveform is formed going from the zero-cross position of the sine wave potential waveform shown in FIG. 7H to a position slightly exceeding the maximum value. As shown in FIGS. 7A–7D, the ports P0, P2 are set to "H", the ports P1, P3 are set to "L", the switch SW1 is closed, the switch SW3 is opened, the common terminal 22a of the switch SW5 is selected to the selector terminal 23a, and the common terminal 22b is selected to the selector terminal 24b (see FIG. 3).

As a result, the switch SW2 is controlled by the pulse control signal from the PWM output terminal while the connection between the discharge resistor 8 and the capacitor 7 is opened, and the capacitor 7 is charged each time the switch SW2 is opened and closed.

The pulse control signal output in Phase 1 has a length of 21 units. More specifically, since the length of one unit is 96 microseconds, the total length is approximately 2 milliseconds (msec). As a result, the pulse width and pulse "off" width of the pulse control signal for each period are set up so that the charge potential of the capacitor 7 traces the increase from the zero-cross position to the maximum position of a sine wave curve.

The terminals of the capacitor 7 are connected to the output terminals 22a, 22b connected to the piezoelectric substrate 13. As a result, discharge current is always flowing and trying to lower itself through the internal resistance of the piezoelectric substrate 13, including the periods when charging is taking place repeatedly (this downward reduction is referred to as natural discharge). If an identical counterelectromotive force is generated in the coil 4, the increase in the charge potential is dependent on the charge potential. Although increases can take place easily while the charge potential is low, they become more difficult as the charge potential increases.

As a result, for the charge potential waveform to be an upwardly sloping sine wave, a pulse control signal with a small duty cycle is used to provide a short on time for the switch SW2 when the charge potential is low. As the charge potential increases, the duty cycle must be gradually increased and the on time for the switch SW2 must be made longer so that the generated counterelectromotive force is increased. With the pulse control signal output in Phase 1, the duty cycle in one period is increased at a fixed proportion relative to the duty cycle from the immediately prior period, as shown in detail in FIG. 7E1.

By repeating, during phase 1, the charging operation with the pulse control signal, at the end of phase 1 a charge potential of +100 V is achieved between the high potential side electrode 7a and the ground-side electrode 7b of the capacitor 7, as shown in FIG. 7G.

In Phase 2, a pulse control signal that is 7 units long in this example is output so that the charge potential waveform of the capacitor 7 forms a path from the maximum value of a sine waveform to a position where the slope is identical to the slope of natural discharge. More specifically, during this interval the charge potential drops due to natural discharge but the waveform of the charge potential lowered by natural discharge is lower than the waveform of a charge potential forming a continuous sine wave from the maximum value. Therefore, the switch SW2 is controlled by the pulse control signal to repeatedly charge the capacitor 7 and to obtain a charge potential that matches a sine wave.

Thus, in Phase 2, the duty cycle for the first period is roughly identical to the duty cycle for the last period of Phase 1. Each duty cycle is reduced by a fixed proportion from the duty cycle of the previous period so that the duty cycle of the final period roughly converges to 0% (see FIG. 7E1).

Figure 4:
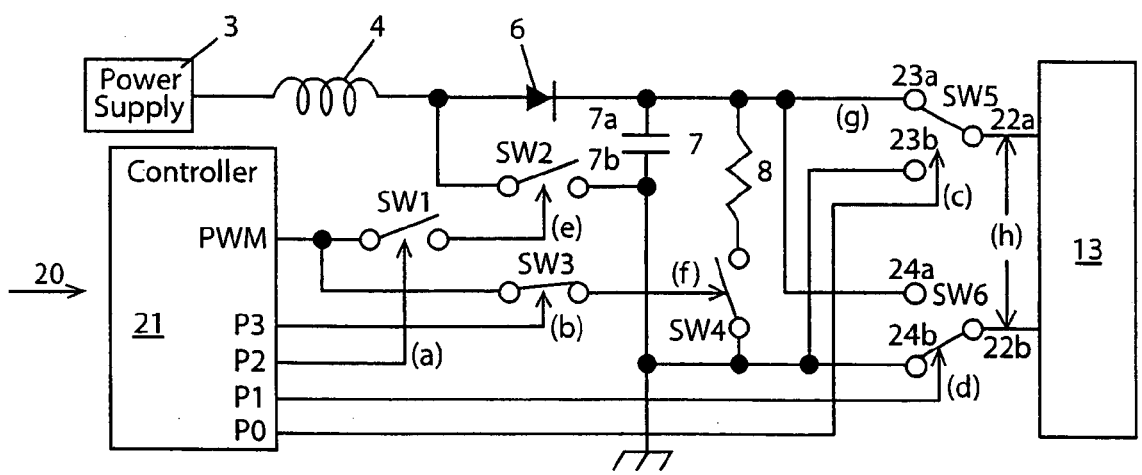
FIG. 4 is a circuit diagram illustrating the operation of the switches in the wave-shaping circuit, according to an embodiment of the present invention, in Phases 3 and 4.

In Phases 3 and 4, the potential waveform of the charge potential forms a path from a position on the sine wave potential waveform shown in FIG. 7H where the slope matches the slope of the natural discharge to the zero-cross position. From the control signal states in Phases 1 and 2, the port P3 is set to "H", the port P2 is set to "L", and, as shown in FIG. 4, the switch SW1 is opened and the switch SW3 is closed.

As a result, the switch SW2 is disconnected from the PWM output terminal and the SW4 is controlled by the pulse control signal output. When the pulses of the pulse control signal is received, the charge potential of the capacitor 7 drops due to the discharge current flowing through the discharge resistor 8.

During this Phase 3 and 4 interval, the charge potential for forming a sine wave is lower than the charge potential lowered by natural discharge. Therefore, while the discharge resistor 8 is controlled by the pulse control signal, the charge potential of the capacitor 7 is lowered by the discharge current flowing through the discharge resistor 8.

During Phase 3, pulse control signals that are 7 units long in this example are sent to the switch SW4 so that the charge potential waveform of the capacitor 7 starts from a position on the sine waveform where the slope matches that of the natural discharge (the endpoint of Phase 2) and continuously approximates the sine wave waveform. If the discharge resistor 8 is connected in parallel to the capacitor 7 and the charge potential of the capacitor 7 is to be lowered, the charge potential drops easily when the charge potential is high but less easily when the charge potential is low, which is opposite from when charging takes place. Thus, the pulse control signal in Phase 3 has a duty cycle of 0% for the first period and the duty cycle increases by a fixed proportion up to the last period in Phase 3 (see FIG. 7F1).

When the Phase 3 pulse control signals repeatedly perform discharging operations and the charge potential is lowered to a certain port, the charge potential tends not to drop as easily. The pulse control signals in Phase 4 have a duty cycle for the first period that is 40% greater than the pulse control signals in Phase 3. This duty cycle is increased by a fixed proportion up to the final period, which is formed by 9 units (see FIG. 7F1).

When the discharge operations controlled by the pulse control signals in Phase 4 are completed, the charge potential of the capacitor has dropped to approximately 0V. As a result, a potential waveform is formed between the terminals of the capacitor 7 that approximates a half wave of a sine waveform, as shown in FIG. 7G. The common terminal (output terminal) 22a of the switch SW5 is connected to the selector terminal 23a, and the common terminal (output terminal) 22b of the switch SW6 is connected to the selector terminal 24b. Since the selector terminal 24b is grounded, an output potential is formed between the output terminal 22a and the output terminal 22b that is a half wave of a sine wave where the output terminal 22a is the "plus" side.

With the method described above, the charge potential of the capacitor 7 can be used to increase a low DC potential and to set the slope of potential increases and decreases as desired. Thus, the charge potential can be used directly as the output potential to provide a desired output potential waveform with a high potential. In this embodiment, a charge potential identical to the charge potential in Phase 1 through Phase 4 is formed from Phase 5 through Phase 8 between the terminals 7a, 7b of the capacitor 7. By using the switches SW5, SW6 to switch between the terminals 7a, 7b of the capacitor 7 and the pair of output terminals 22a 22 b, an output potential is formed between the pair of output terminals 22a, 22b that is identical to the charge potential of the capacitor 7 but with reversed polarity, providing an output potential that is twice that of the charge potential of the capacitor 7.

Figure 5:
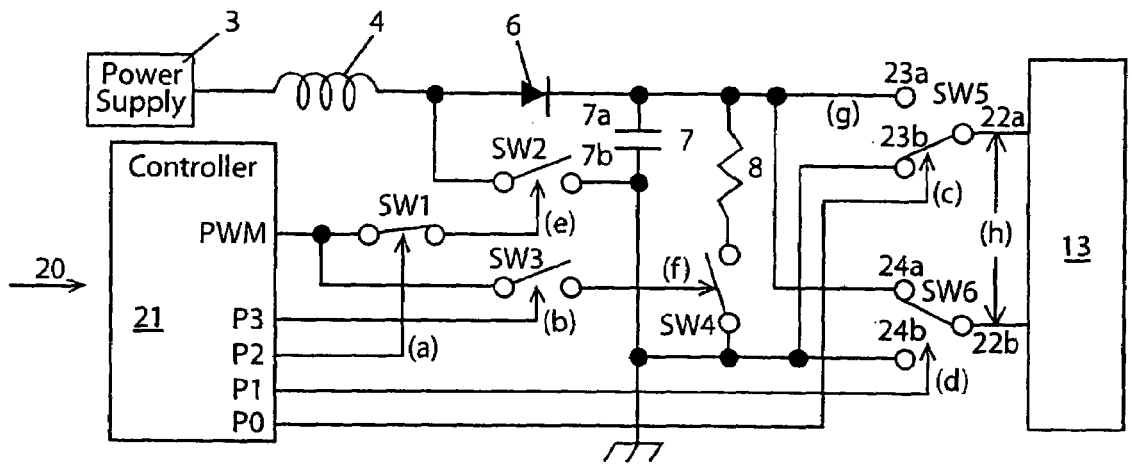
FIG. 5 is a circuit diagram illustrating the operation of the switches in the wave-shaping circuit, according to an embodiment of the present invention, in Phases 5 and 6.
Figure 6:
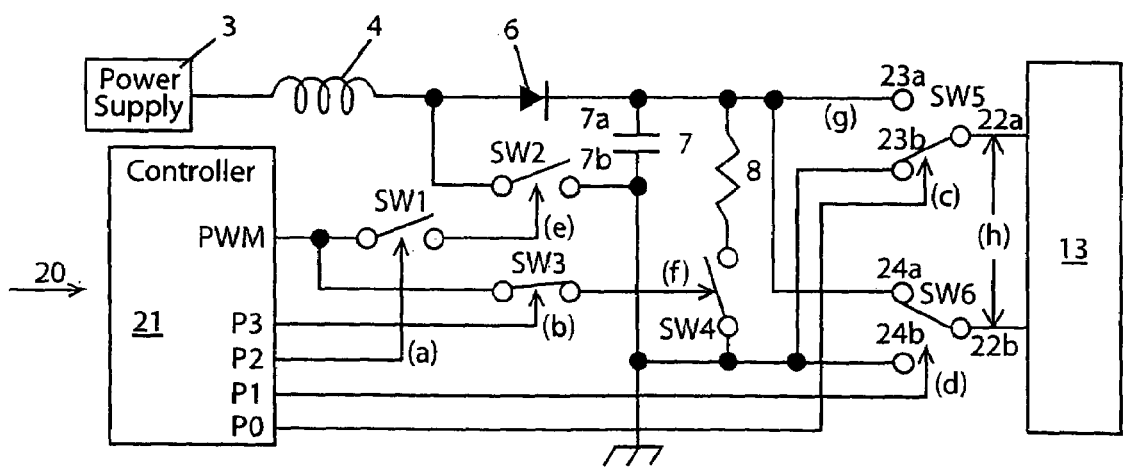
FIG. 6 is a circuit diagram illustrating the operation of the switches in the wave-shaping circuit, according to an embodiment of the present invention, in Phases 7 and 8.
Figure 7:
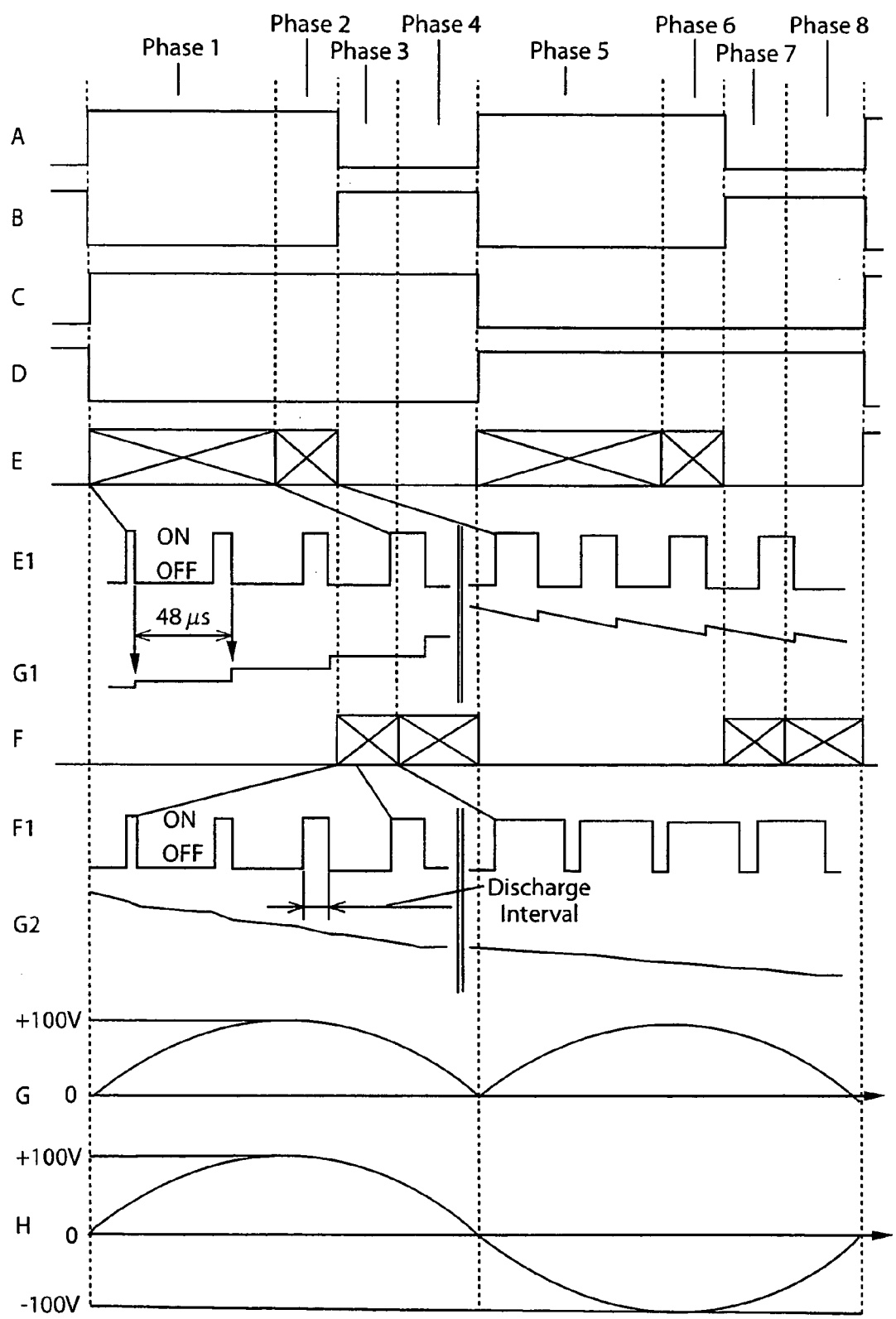
FIGS. 7A–7H are waveform diagrams that show waveforms in the wave-shaping circuit, according to an embodiment of the present invention, from Phases 1–8.

More specifically, from Phase 5 to Phase 8, the port P0 is set to "L" and the port P1 is set to "H" based on the control signal outputs from Phase 1 through Phase 4, as shown in FIGS. 7C and 7D. As shown in FIGS. 5 and 6, the common terminal 22a of the switch SW5 is switched to the selector terminal 23b and the common terminal 22b of the switch SW6 is switched to the selector terminal 24a.

With regard to the behavior of the control signal for the switches SW and the pulse control signal from the PWM output terminal, Phase 5 is identical to Phase 1, Phase 6 is identical to Phase 2, Phase 7 is identical to Phase 3, and the Phase 8 is identical to Phase 4. As a result, from Phase 5 through Phase 8, a potential waveform that is a half wave of a sine waveform identical to Phase 1 through Phase 4 is formed between the terminals 7a, 7b of the capacitor 7, as shown in FIG. 7G.

As a result, a half wave of a sine waveform where the output terminal 22a is the "minus" side is formed as the output potential at the output terminals 22a, 22b. By making this continuous with the output potential formed from Phase 1 through Phase 4, a+/−100 V sine wave is formed. By repeating Phase 1 through Phase 8, an output potential that is a sine wave that can be generated at any time can be provided.

The piezoelectric substrate 12 with drive electrodes connected to the output terminals 22a, 22b is driven by the +/−100V sine wave output potential and vibrates. This in turn vibrates the secured touch panel 11.

Similarly, by setting up appropriate values for the number of phases forming one waveform, the pulse control signals output for each phase, and the control signals of the switches SW, a single wave-shaping circuit 20 can be used to form different types of output potential waveforms.

For example, the intervals of the vibrations felt by the finger used by the operator pressing the touch panel 11 can vary greatly according to the potential waveform of the drive potential driving the piezoelectric substrate 13. In an embodiment, it is possible to have the piezoelectric substrate 13 using different potential waveforms, e.g., those shown in FIG. 9, according to the objective for the vibration and the preference of the operator.

Figure 9A:
FIGS. 9A–9D are waveform diagrams showing various output potential waveforms to drive the piezoelectric substrate, according to an embodiment of the present invention.

FIG. 9A is an output potential waveform that provides feedback similar to the clicking sensation generated when the operator presses a button supported by a disc spring. When pressure is detected, a pulse with a width of 5 to 10 msec is generated twice. As a result, the movable plate 11 is vibrated momentarily two times.

Figure 9B:

FIG. 9B is a sine wave AC output potential waveform with a frequency of 20–30 kHz, which is higher than that of the embodiment described. A sine wave vibration with the same frequency appears at the touch panel 11. As a result, the operator experiences a sensation similar to that of the touch panel 11 being vibrated by a vibration motor.

Figure 9C:
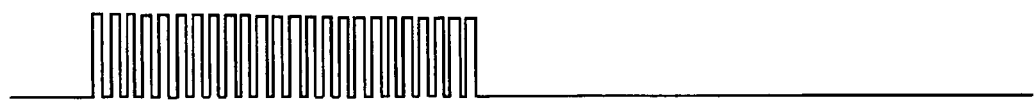

FIG. 9C is an AC output potential waveform with a period of a few hundred microseconds. The touch panel 11 vibrates at the same period. Since the vibration frequency of the touch panel 11 is a few kHz, the vibration is not sensed by the finger. However, since this is in the audible frequency range, a sound is generated if the touch panel 11 is a glass substrate or the like. Thus, an input sensation can be provided for the operator with a sound as well. In this case, there is no need to provide a speaker for generating the sound.

Figure 9D:
Figure 10:
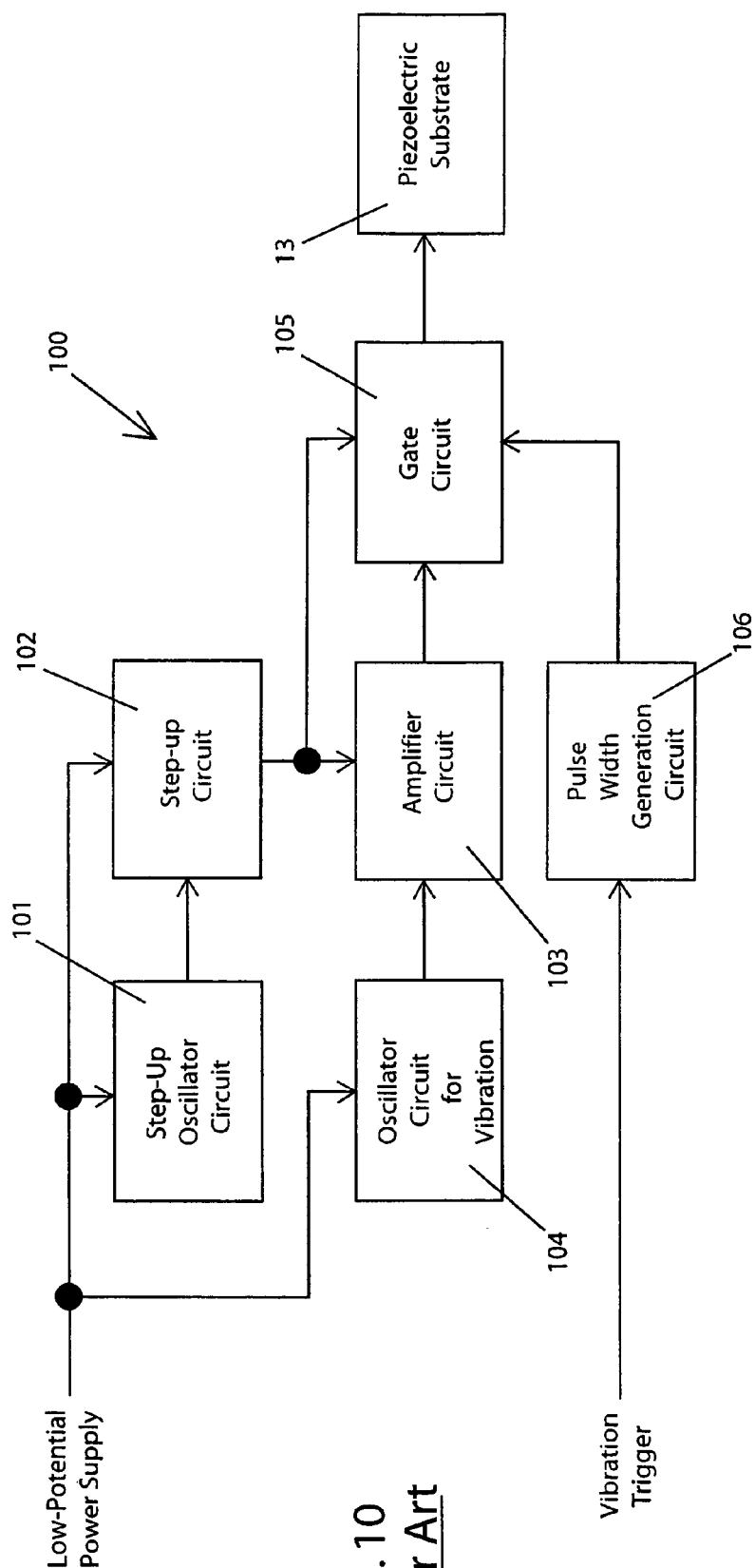
FIG. 10 is a block diagram of a conventional wave-shaping circuit equipped with a potential step-up circuit.

FIG. 9D combines the output potential waveforms from FIGS. 9A and 9C. The operator first receives a clicking sensation from the finger, and then hears the sound to confirm that a touch operation has been performed.

In the embodiment described above, the switch SW5 and the switch SW6 are controlled independently with control signals from the port P0 and the port P1. Thus, when the power supply is off when the product is being shipped and the touch panel input device 10 is not being used, the output terminal 22a and the output terminal 22b connected to the piezoelectric substrate 13 can be connected to the high-potential selector terminals 23a, 24a or the ground-side selector terminals 23b, 24b. Thus, when the piezoelectric substrate 13 is not being used, the drive electrodes of the piezoelectric substrate 13 can be shorted so that it is possible to prevent degradation of the piezoelectric substrate 13 caused by accidental flow of DC current between the drive electrodes.

Also, in the embodiment described above, in addition to the load 13 connected to the output terminals 22a, 22b there is the capacitor 7 charged by the counterelectromotive force from the coil 4. Since the same charge potential is present in the internal capacitance of the load 13 connected in parallel to the capacitor 7, it is possible to eliminate the capacitor 7 and make the internal capacitance of the load 13 serve as the capacitor charged by the counterelectromotive force from the coil 4.

Furthermore, in the embodiment above, the switch SW2 and the switch SW4 are opened and closed by a common pulse control signal from the PWM output terminal. However, it is also possible to have a pulse control signal that controls the switch SW2 and a separate pulse control signal that controls the switch SW4, with one being sent to the switch SW2 and the other sent to the switch SW4.

The present invention relates to a wave-shaping circuit having a DC low-potential power supply as the power supply and sending to a circuit module an output potential that is high-potential and that has a predetermined potential waveform.

The above, and other objects, features and advantages of the present invention will become apparent from the following description read in conjunction with the accompanying drawings, in which like reference numerals designate the same elements.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A wave-shaping circuit comprising:
   an inductor connected in series to a DC power supply and to a charging switch;
   a capacitor connected in parallel to said charging switch;
   a reverse-current preventing element disposed between said inductor and said capacitor, with a forward direction being directed from said inductor to said capacitor;
   a discharge resistor connected parallel to said capacitor and connected in series with a discharge switch; and
   a controller selectively sending a pulse control signal to a selected switching element selected from the group consisting of said charging switch and said discharge switch, said controller setting a pulse on width and a pulse off width for the pulse control signal during each pulse repetition period;
   wherein said pulse control signal opens and closes said selected switching element, thereby altering a charge potential of said capacitor so that a desired output potential waveform increased from a potential of said DC power supply is formed between a pair of output terminals connected to terminals of said capacitor.

2. A wave-shaping circuit as described in claim 1, further comprising:
   selecting means disposed between said pair of output terminals for reversing connections therebetween;
   wherein said output potential waveform formed between said pair of output terminals has a polarity that is inverted from said charge potential of said capacitor.

3. A wave-shaping circuit as described in claim 1, wherein said pulse control signal is a modulated signal in which a duty cycle is changed for each pulse repetition cycle via pulse width modulation.

4. A wave-shaping circuit as described in claim 1, wherein said capacitor is an internal capacitor of a load connected between said pair of output terminals.

5. A wave-shaping circuit as described in claim 2, wherein said pulse control signal is a modulated signal in which a duty cycle is changed for each pulse repetition cycle via pulse width modulation.

6. A wave-shaping circuit as described in claim 2, wherein said capacitor is an internal capacitor of a load connected between said pair of output terminals.

7. A wave-shaping circuit as described in claim 3, wherein said capacitor is an internal capacitor of a load connected between said pair of output terminals.

8. A wave-shaping circuit as described in claim 5, wherein said capacitor is an internal capacitor of a load connected between said pair of output terminals.

9. A wave-shaping circuit comprising:
an inductor connected in series to a DC power supply and to a charging switch;
a capacitor connected in parallel to said charging switch;
a reverse-current preventing element disposed between said inductor and said capacitor, with a forward direction being directed from said inductor to said capacitor;
a discharge resistor connected parallel to said capacitor and connected in series with a discharge switch and
a controller selectively sending a pulse control signal to a selected switching element selected from the group consisting of said charging switch and said discharge switch, said controller setting a pulse on width and a pulse off width for the pulse control signal during each pulse repetition period;
wherein said pulse control signal opens and closes said selected switching element, thereby altering a charge potential of said capacitor so that a desired output potential waveform increased from a potential of said DC power supply is formed between a pair of output terminals connected to terminals of said capacitor,
wherein said pulse control signal is a modulated signal in which a duty cycle is changed for each pulse repetition cycle via pulse width modulation, and
wherein a vibrating element connected between said pair of output terminals is vibrated by an output potential of said desired output potential waveform.

10. A wave-shaping circuit as described in claim 9, wherein:
said vibrating element is a piezoelectric substrate secured to a touch panel of a touch panel input device, and when an input operation that applies sufficient pressure to the touch panel to cause contact and electrical continuity between conductor layers of the touch panel is detected by the touch panel input device, the wave shaping circuit is operated to produce said desired output potential waveform and said output potential of said desired output potential waveform vibrates said piezoelectric substrate.

11. A wave-shaping circuit comprising:
an inductor connected in series to a DC power supply and to a charging switch;
a capacitor connected in parallel to said charging switch;
a reverse-current preventing element disposed between said inductor and said capacitor, with a forward direction being directed from said inductor to said capacitor;
a discharge resistor connected parallel to said capacitor and connected in series with a discharge switch;
a controller selectively sending a pulse control signal to a selected switching element selected from the group consisting of said charging switch and said discharge switch, said controller setting a pulse on width and a pulse off width for the pulse control signal during each pulse repetition period; and
selecting means disposed between said pair of output terminals for reversing connections therebetween;
wherein said pulse control signal opens and closes said selected switching element, thereby altering a charge potential of said capacitor so that a desired output potential waveform increased from a potential of said DC power supply is formed between a pair of output terminals connected to terminals of said capacitor,
wherein said output potential waveform formed between said pair of output terminals has a polarity that is inverted from said charge potential of said capacitor,
wherein said pulse control signal is a modulated signal in which a duty cycle is changed for each pulse repetition cycle via pulse width modulation, and
wherein a vibrating element connected between said pair of output terminals is vibrated by an output potential of said desired output potential waveform.

12. A wave-shaping circuit as described in claim 11, wherein:
said vibrating element is a piezoelectric substrate secured to a touch panel of a touch panel input device, and when an input operation that applies sufficient pressure to the touch panel to cause contact and electrical continuity between conductor layers of the touch panel is detected by the touch panel input device, the wave shaping circuit is operated to produce said desired output potential waveform and said output potential of said desired output potential waveform is used to vibrate said piezoelectric substrate.

* * * * *